US012561507B2

(12) United States Patent (10) Patent No.: US 12,561,507 B2

Ma et al. (45) Date of Patent: Feb. 24, 2026

(54) MACHINE LEARNING-BASED HOTSPOT PREDICTION IN ELECTRONIC DESIGN AUTOMATION (EDA) APPLICATIONS

(71) Applicant: Siemens Industry Software Inc., Plano, TX (US)

(72) Inventors: Yuansheng Ma, Fremont, CA (US); Le Hong, Benicia, CA (US)

(73) Assignee: Siemens Industry Software Inc., Plano, TX (US)

( * ) Notice: Subject to any disclaimer, the term of this patent is extended or adjusted under 35 U.S.C. 154(b) by 612 days.

(21) Appl. No.: 18/002,159

(22) PCT Filed: Jul. 8, 2020

(86) PCT No.: PCT/US2020/041174

§ 371 (c)(1),
(2) Date: Dec. 16, 2022

(87) PCT Pub. No.: WO2022/010469

PCT Pub. Date: Jan. 13, 2022

(65) Prior Publication Data

US 2023/0229845 A1 Jul. 20, 2023

(51) Int. Cl.
*G06F 30/398* (2020.01)
*G06F 30/27* (2020.01)

(52) U.S. Cl.
CPC ............ *G06F 30/398* (2020.01); *G06F 30/27* (2020.01)

(58) Field of Classification Search
CPC ................................ G06F 30/398; G06F 30/27

(Continued)

(56) References Cited

U.S. PATENT DOCUMENTS 8,504,949 B2 * 8/2013 Robles .................. G06F 30/398
716/52
9,626,459 B2 * 4/2017 Agarwal .............. G06V 10/245
(Continued)

FOREIGN PATENT DOCUMENTS

TW 1611252 B 1/2018

OTHER PUBLICATIONS

Duo, Ding et al: "High Performance Lithography Hotspot Detection WithSuccessively Refined Pattern Identifications and Machine Learning";IEEE Transactions on Computer Aided Design ofintegrated Circuits and Systems; vol. 30; No. 11; Nov. 1, 2011; pp. 1621-1634; DOI: 10.1109/TCAD.2011.2164537.

(Continued)

*Primary Examiner* — Suchin Parihar

(57) ABSTRACT

A computing system may include a hotspot processing engine and a hotspot prediction engine. The hotspot processing engine may be configured to access an input data set of hotspot locations on manufactured circuits of a circuit design, correlate the hotspot locations to layout data for the circuit design, and extract fragment feature vectors for the hotspot locations. The hotspot processing engine may further be configured to process the fragment feature vectors such that hotspot fragment feature vectors are a threshold percentage of the total number of feature vectors in the fragment feature vectors and provide the processed fragment feature vectors as a training set for training a machine-learning model. The hotspot prediction engine may be configured to apply the machine-learning model to characterize locations of the circuit design as a hotspot location or a non-hotspot location.

15 Claims, 8 Drawing Sheets

(58) Field of Classification Search
USPC ......................................................... 716/112
See application file for complete search history.

(56) References Cited

U.S. PATENT DOCUMENTS

| | | | |
|---|---|---|---|
| 10,621,302 B2 * | 4/2020 | Sha .......................... | G06F 30/27 |
| 11,403,564 B2 * | 8/2022 | Chiang ................... | G06N 20/00 |
| 2009/0136121 A1 | 5/2009 | Nakagaki et al. | |
| 2013/0031518 A1 * | 1/2013 | Robles .................. | G06F 30/398 |
| | | | 716/52 |
| 2014/0358830 A1 * | 12/2014 | Chiang ............... | G03F 7/70433 |
| | | | 706/12 |
| 2015/0213374 A1 * | 7/2015 | Agarwal ............. | G06F 18/2411 |
| | | | 706/12 |
| 2019/0087526 A1 * | 3/2019 | Park ........................ | G06N 20/00 |
| 2019/0287021 A1 * | 9/2019 | Chiang ................... | G06T 7/001 |

OTHER PUBLICATIONS

Wuu, Jen-Vi et al: "Detecting context sensitive hot spots in standard celllibraries"; Proceedings of SPIE; vol. 7275; Mar. 13, 2009; pp. 727515-1-727515-9, DOI: 10.1117/12.814316.

Cao Kui-Kang; "Lithography hotspot detection based on support vector machine and genetic algorithm"; Journal of Zhejiang University (Science Edition); vol. 01; pp. 41-45.

Kaisheng Luo; "Research on Nanoscale Circuit Resolution Enhancement Technology and Hotspot Detection Technology"; Chinese Doctoral Dissertation Full-text Database Information Technology Series; vol. 2015/07; Jul. 15, 2015.

Wuu Jen-Yi; "Detecting Context Sensitive Hot Spots in Standard Cell Libraries"; Design for Manufacturability Through Design-Process Integration III; Jan. 1, 2009.

\* cited by examiner

Computing System 100

Hotspot Processing Engine 110

Hotspot Prediction Engine 112

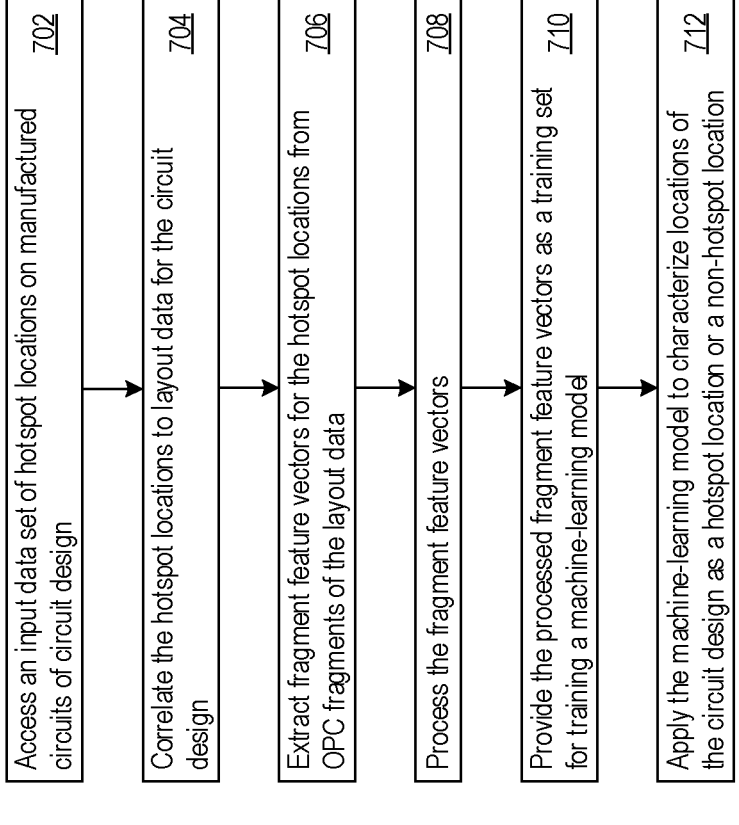

700

Access an input data set of hotspot locations on manufactured circuits of circuit design     702

Correlate the hotspot locations to layout data for the circuit design     704

Extract fragment feature vectors for the hotspot locations from OPC fragments of the layout data     706

Process the fragment feature vectors     708

Provide the processed fragment feature vectors as a training set for training a machine-learning model     710

Apply the machine-learning model to characterize locations of the circuit design as a hotspot location or a non-hotspot location     712

Figure 7

MACHINE LEARNING-BASED HOTSPOT PREDICTION IN ELECTRONIC DESIGN AUTOMATION (EDA) APPLICATIONS

BACKGROUND

Electronic circuits, such as integrated circuits, are used in nearly every facet of modern society, from automobiles to microwaves to personal computers and more. Design of circuits may involve many steps, known as a "design flow." The particular steps of a design flow are often dependent upon the type of circuit being designed, its complexity, the design team, and the circuit fabricator or foundry that will manufacture the circuit. Electronic design automation (EDA) applications support the design and verification of circuits prior to fabrication. EDA applications may implement various EDA procedures, e.g., functions, tools, or features to analyze, test, or verify a circuit design at various stages of the design flow.

BRIEF DESCRIPTION OF THE DRAWINGS

Certain examples are described in the following detailed description and in reference to the drawings.

FIG. 7 shows an example of logic that a system may implement to support ML-based hotspot prediction.

DETAILED DESCRIPTION

Figure 1:
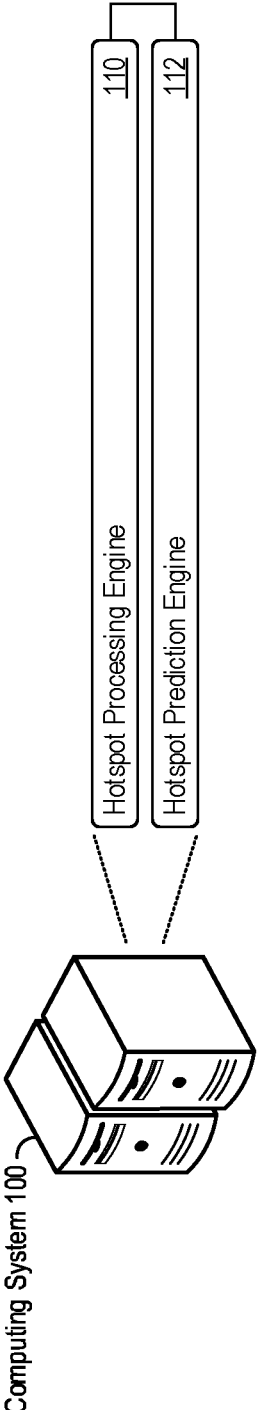
FIG. 1 shows an example of a computing system that supports machine learning ("ML")-based hotspot prediction.

Modern circuit design technologies can provide various mechanisms to detect potential or actual defects that can occur in manufactured circuits. Traditional optical rule check ("ORC") processes may utilize lithographical compact model simulations to detect circuit failures during design phases. As technology node sizes in circuit designs continue to decrease, ORC-based defect detections may be incapable of identifying all circuit defects during the design phase, and various defects undetected during design phase ORC checks may be present in manufactured circuit wafers.

Optical proximity correction ("OPC") verifications are typically limited to checking circuit designs for a single defect criteria, doing so for specific defect characteristics or parameter thresholds, e.g., process window bandwidths or circuit parameters specific to pinch, shore, bridge, or other common circuit defects that result in circuit hotspots. As used herein, a "hotspot" may refer to any area in a circuit that is defective (e.g., an improperly manufactured circuit component unintended by a circuit design or a flaw in the circuit design itself). On a manufactured circuit wafer, circuit hotspots are commonly complex in nature, as variations in circuit design characteristics and manufacture process parameters can cause circuit defects to arise from a combination of multiple factors. As such, calibrated OPC models and other ORC processes performed on circuit designs may be insufficient to identify the entire range of circuit defects that can arise during physical manufacture of the circuit design.

Physical inspection of manufactured chips is another way to detect actual-occurring circuit defects. Such inspection techniques are often bandwidth limited, and high-precision inspection technologies like scanning electron beam microscopy ("SEM") can not be practically used to inspect entire chip wafers (as doing so would require inordinate amounts of time and resources). Accordingly, prediction of circuit hotspots and defects may be more efficiently performed through circuit design analyses. While adapting ORC parameters or using fuzzy geometrical pattern matching of known defects have been attempted to detect potential defect locations and circuit hotspots in a circuit design, such techniques typically yield low accuracy in predicting actual defects on manufactured circuits. Effective and efficient prediction of circuit hotspots (also referred to as care area generation) can be challenging for modern EDA applications.

The disclosure herein may provide systems, methods, devices, and logic in support of ML-based hotspot prediction. Various ML-based hotspot prediction features described herein may provide for technology to process identified hotspots (e.g., identified circuit defects) in a meaningful matter to support training of machine learning models to support subsequent hotspot prediction. For instance, hotspot processing features described herein may include extracting feature vectors from layout data corresponding to identified hotspots on manufactured circuits and correlating layout geometry in circuit designs to identified defects resulting from circuit manufacture. Moreover, various data balancing features are presented herein to ensure processed fragment feature vectors to be used as ML training data can increase the accuracy and range of hotspot prediction/care area generation. Through the ML-based hotspot prediction features described herein, potential and actual manufacturing defects in circuit designs may be identified with increased efficiency and accuracy, and circuit manufacture yields may increase as a result.

These and other ML-based hotspot prediction features and technical benefits according to the present disclosure are described in greater detail herein.

FIG. 1 shows an example of a computing system 100 that supports ML-based hotspot prediction. The computing system 100 may take the form of a single or multiple computing devices such as application servers, compute nodes, desktop or laptop computers, smart phones or other mobile devices, tablet devices, embedded controllers, and more. In some implementations, the computing system 100 may be an EDA system that implements, supports, or hosts an EDA application or other EDA-based capabilities. In that regard, the computing system 100 may support care area generation for circuit designs to process detected hotspots in manufactured circuits, predict hotspot locations in a circuit design, and more.

As an example implementation to support any combination of the ML-based hotspot prediction features described herein, the computing system 100 shown in FIG. 1 includes a hotspot processing engine 110 and a hotspot prediction engine 112. The computing system 100 may implement the engines 110 and 112 (including components thereof) in various ways, for example as hardware and programming. The programming for the engines 110 and 112 may take the form of processor-executable instructions stored on a non-transitory machine-readable storage medium and the hardware for the engines 110 and 112 may include a processor to execute those instructions. A processor may take the form of single processor or multi-processor systems, and in some examples, the computing system 100 implements multiple engines using the same computing system features or hardware components (e.g., a common processor or a common storage medium).

In operation, the hotspot processing engine 110 may access an input data set of hotspot locations on manufactured circuits of a circuit design, correlate the hotspot locations to layout data for the circuit design, and extract fragment feature vectors for the hotspot locations from optical proximity correction ("OPC") fragments of the layout data, including hotspot fragment feature vectors and non-hotspot fragment feature vectors for the hotspot locations. The hotspot processing engine 110 may further process the fragment feature vectors such that the hotspot fragment feature vectors are a threshold percentage of the total number of feature vectors in the fragment feature vectors and provide the processed fragment feature vectors as a training set for training a machine-learning model. In operation, hotspot prediction engine 112 may apply the machine-learning model to characterize locations of the circuit design as hotspot locations or non-hotspot locations.

These and other ML-based hotspot prediction features are described in greater detail next. In particular, example hotspot processing features in support of ML-based hotspot prediction are described with reference to FIGS. 2-5 and example ML model application features for hotspot prediction are described with reference to FIG. 6.

Figure 2:
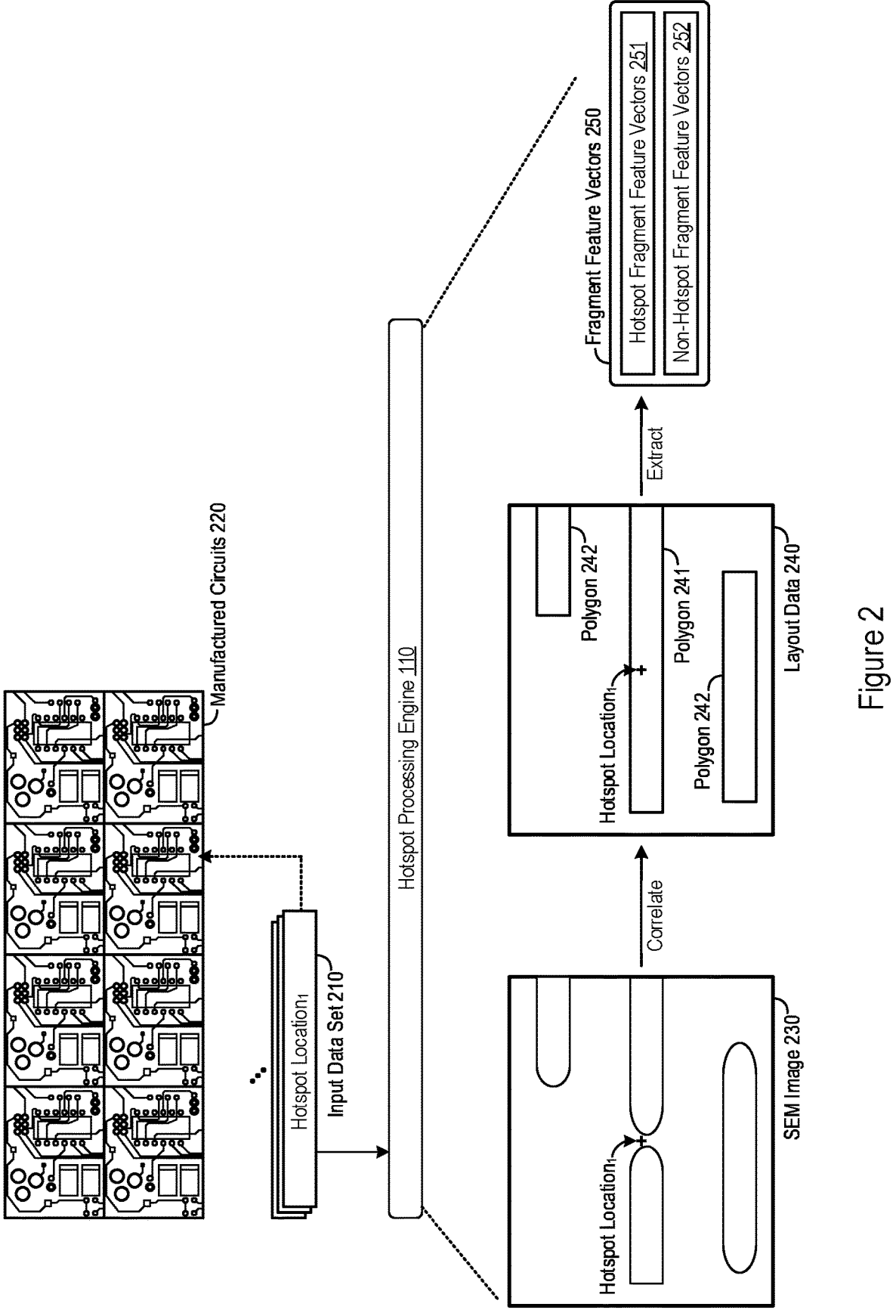
FIG. 2 shows an example of feature vector extraction in support of ML-based hotspot prediction.

FIG. 2 shows an example of feature vector extraction in support of ML-based hotspot prediction. The example in FIG. 2 is presented using the hotspot processing engine 110 as an illustrative implementation example, though various other computing implementations of the described features are contemplated herein as well.

In support of ML-based hotspot prediction, the hotspot processing engine 110 may access and process hotspot data into a training data for a machine-learning model configured to support hotspot prediction. Raw hotspot data may not be directly feasible as machine learning training data, for example as image-based recognition or fuzzy pattern matching techniques used to detect such raw images may be incapable of accurately or comprehensively predicting potential circuit hotspots (and may thus be insufficient as a training set and limiting the classification or prediction capabilities of a ML model trained using such raw data). The hotspot processing features described herein, however, may provide various correlation, analysis, and balancing capabilities to process EDA, circuit, or other relevant data into a training set by which ML-based hotspot prediction may be implemented with increased efficiency, accuracy, and hotspot prediction coverage for full-chip designs.

In some implementations, the hotspot processing engine 110 may extract representative data for hotspots (e.g., defects) detected on manufactured circuits of a circuit design. One such form is to extract feature vectors, as discussed in greater detail herein, which the hotspot processing engine 110 may extract from hotspot data to capture, characterize, or represent specific hotspots detected on manufactured circuits. In the example of FIG. 2, the hotspot processing engine 110 may access an input data set 210, which may include hotspot locations detected on manufactured circuits 220 of a particular circuit design.

The input data set 210 may be represented in any number of forms, and may vary based on a particular imaging or detection technique used to identify the circuit defects on the manufactured circuits 220. In some examples, the manufactured circuits 220 may include one or more circuit wafers or circuit lots manufactured with specific process parameters. Defects on the manufactured circuits 220 may be physically detected using any number of circuit imaging techniques, such as bright field inspection ("BFI") techniques, SEM techniques, or any other circuit inspection process. In such cases, hotspot locations may be represented in the input data set 210 as positional identifiers, circuit coordinates, captured image data (e.g., centered around a detected hotspot location), and the like. As an illustrative example shown in FIG. 2, the input data set 210 includes hotspot data for a hotspot location labeled as hotspot $location_1$, which may be represented as an SEM image 230 centered at hotspot $location_1$. The particular circuit defect detected in the SEM image 230 of hotspot $location_1$ may be a pinch type defect.

The hotspot processing engine 110 may correlate hotspot locations detected on physically manufactured circuits to layout data for a circuit design. Layout data may refer to or include any circuit data for a given circuit design, e.g., at a polygon-level of a circuit design. As such, layout data may refer to a physical circuit design that includes, describes, or represents specific geometric elements (e.g., polygons) that define the shapes and circuit components that will be created in various circuit materials in order to physically manufacture the circuit. Through layout data (also referred to as a layout design), physical layers of a physical circuit can have a corresponding layer representation in the layout design, and the geometric elements described in a layer representation can define the relative locations of the circuit device components that will make up the a physically-manufactured circuit.

In the example of FIG. 2, the hotspot processing engine 110 correlates hotspot $location_1$ (as represented through the SEM image 230) to the layout data 240. The layout data 240 may include a portion of a layout design that includes the position of hotspot $location_1$ in a given layer of the layout design as well as surrounding geometric elements, such as the geometric elements labeled as polygons 241, 242, and 243. To correlate a given hotspot location to layout data, the hotspot processing engine 110 may identify a position in a layout design at which the given hotspot location occurs. For instance, the SEM image 230 may depict or detect hotspot $location_1$ at a particular location and physical layer in a physically-manufactured chip, whether specified via circuit coordinates, physical measures or offsets from a particular circuit position, and the like. The hotspot processing engine 110 may then identify this particular location in layout data of the circuit design, which may include positional coordinates as well as a target layer corresponding to the physical chip location at which hotspot $location_1$ occurs.

In correlating hotspot locations to layout data, the hotspot processing engine 110 may determine an extraction window in the layout data that covers a given hotspot location. The extraction window may refer to a circuit region surrounding hotspot location from which the hotspot processing engine 110 may extract feature vectors to support ML-based hotspot prediction. The hotspot processing engine 110 may determine extraction windows in layout data according to any number of extraction window parameters or criteria. In some instances, the dimensions, size, shape, or other characteristics of extraction windows for circuit hotspots may be predetermined or user-configurable. For instance, the hotspot processing engine 110 may determine an extraction window for a given hotspot location as a fixed bounding box centered at the position of the hotspot location in the layout data of a circuit design (e.g., as a 500 nanometer ("nm") by 500 nm square bounding box surrounding the given hotspot location). As another example, an extraction window determined by the hotspot processing engine 110 may match a depicted image of hotspot locations captured via BFI, SEM, or other imaging-based defect detection techniques (e.g., an extraction window in the layout data 240 that matches the dimensions, shape, and location of the SEM image 230 for hotspot location$_1$).

In some implementations, the hotspot processing engine 110 may determine an extraction window by expanding the dimensions of a hotspot image (SEM image, BFI image, or any other image-based representation of a hotspot location). For instance, the hotspot processing engine 110 may set an extraction window in layout data of a circuit design by expanding SEM image dimensions by a fixed value in each direction (e.g., expanding by 200 nm), by a multiple of the dimension values of the SEM image 230 detection (e.g., 2× each perimeter dimension), and in various other ways. By expanding the region of a layout design surrounding a hotspot location from hotspot images, the hotspot processing engine 110 may support extraction of features from circuit portions of an increased range that may potentially contribute to circuit defects, including both hotspot and non-hotspot portions of the layout design, as discussed further herein.

As yet another example, the hotspot processing engine 110 may variably determine an extraction window for a given hotspot location based on a position of the given hotspot location in the circuit design (e.g., in the layout data) and an uncertainty range of an imaging technique used to detect the given hotspot location in the manufactured circuits 220. SEM imaging techniques may, for example, have an uncertainty range of 10-12 nm, and the hotspot processing engine 110 may determine an extraction window for hotspot locations detected through SEM techniques as a function of the uncertainty range and position of the hotspot location. As one example, the hotspot processing engine 110 may determine an extraction window for a given hotspot location represented as a SEM image as a bounding shape in layout data with dimensions determined as a multiple of the uncertainty range of the SEM image (e.g., 10× the uncertainty range). In any of the ways described herein, the hotspot processing engine 110 may determine extraction windows in layer data of a circuit design for hotspot locations.

From such extraction windows in the layout design of a circuit, the hotspot processing engine 110 may extract feature vectors to characterize the detected hotspot and support generation of training data to support ML-based hotspot prediction. The extraction window may, in effect, represent a particular partition of layout data from which the hotspot processing engine 110 may extract feature vectors to characterize the particular partition (or particular elements thereof). As described herein, the hotspot processing engine 110 may label extracted feature vectors and use the labeled feature vectors as training data for ML modeling. Extracted feature vectors may be represented (e.g., labeled) by the hotspot processing engine 110 as relating to hotspot portions of a circuit design, non-hotspot portions of the circuit design, or in various other ways. Many of the examples presented herein are in the form of binary classification (e.g., hotspot or not-hotspot). However, multi-class labeling is supported by the hotspot processing engine 110 as well, for example by distinguishing and labeling generated training data according to specific hotspot types (e.g., pinch, bridge, etc.).

The hotspot processing engine 110 may extract feature vectors for delineated sub-portions of an extraction window. In some implementations, the hotspot processing engine 110 extracts feature vectors on a per-fragment basis, doing so for polygons or geometric elements of layout data decomposed into OPC fragments. In that regard, the hotspot processing engine 110 may determine a given subset of OPC fragments in an extraction window as hotspot fragments and another of subset of OPC fragments in the extraction window as non-hotspot fragments. Then, the hotspot processing engine 110 may extract feature vectors from the determined hotspot fragments (referred to herein as hotspot fragment feature vectors) as well as extract feature vectors from the determined non-hotspot fragments (referred to herein as non-hotspot fragment feature vectors).

In the example shown in FIG. 2, the hotspot processing engine 110 extracts the fragment feature vectors 250 for the hotspot locations represented in the input data set 210. The fragment feature vectors 250 extracted by the hotspot processing engine 110 may include hotspot fragment feature vectors 251 and non-hotspot fragment feature vectors 252. Example features regarding determination of hotspot and non-hotspot fragments in layout data and feature vector extraction are described next with reference to FIG. 3.

Figure 3:
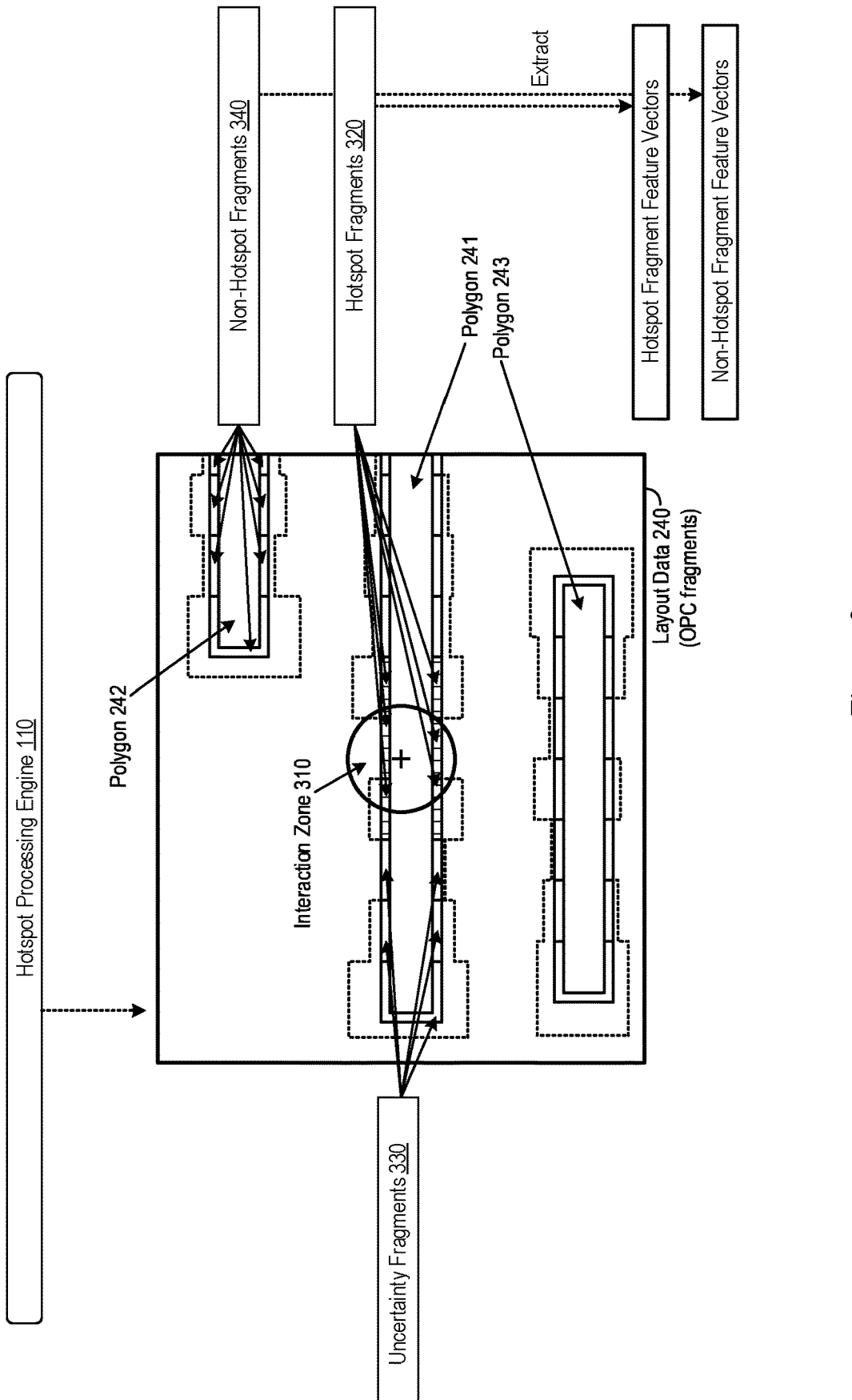
FIG. 3 shows an example determination of hotspot and non-hotspot fragments and corresponding feature vector extraction from layout data by a hotspot processing engine.

FIG. 3 shows an example determination of hotspot and non-hotspot fragments and corresponding feature vector extraction from layout data by the hotspot processing engine 110. In the particular example shown in FIG. 3, the hotspot processing engine 110 extracts fragment feature vectors for an extraction window defined for the layout data 240 described in FIG. 2, which includes hotspot location$_1$ and polygons 241, 242, and 243 (or at least some portion of these polygons).

The layout data 240 shown in FIG. 3 is decomposed into OPC fragments, and various OPC fragments of the polygons 241, 242, and 243 are shown in the layout data 240 as thin rectangular boxes that form the perimeter of the polygons 241, 242, and 243. OPC processes of EDA applications may introduce serifs, indentations, or other polygon adjustments applied to lithographic masks to compensate for diffractive effects during lithographic manufacturing processes. Such polygon adjustments are depicted for illustrative purposes as a dotted perimeter that surrounds the polygons 241, 242, and 243 in FIG. 3.

The hotspot processing engine 110 may access layout data 240 that includes decomposed OPC fragments from EDA applications, as OPC or other EDA-based resolution enhancement techniques (RET) may generate fragmented layout data. Delineations of polygon-level data (e.g., decomposed into OPC fragments) may provide a mechanism through which the hotspot processing engine 110 may perform feature vector extraction for different portions of an extraction window or circuit design, thus allowing for labeling of training data to support subsequent ML modeling and hotspot prediction. While many of the feature vector extraction examples described herein are presented with reference to OPC fragments, any other delineated sub-portions of circuit designs or layout designs are contemplated herein for feature vector extraction, data characterization, or any forms of hotspot processing to support ML-based hotspot prediction.

For a given extraction window, the hotspot processing engine 110 may classify OPC fragments (or other sub-portions of layout data) into multiple categories. Some or all of the classifications may be used as labels by the hotspot processing engine 110 to form a training data set for a ML model. In the example of FIG. 3, the hotspot processing engine 110 classifies OPC fragments of an extraction window depicted through the layout data 240 as hotspot fragments, uncertainty fragments, or non-hotspot fragments. Each of these classifications and fragment types are described in turn.

As an example classification, the hotspot processing engine 110 may determine hotspot fragments. The hotspot processing engine 110 may determine a selected subset of OPC fragments in an extraction window that characterize the hotspot, which may allow ML techniques to learn specific characteristics, parameters, or aspects of hotspots via the OPC fragments the surround the hotspot. In some implementations, the hotspot processing engine 110 may determine hotspot fragments as any OPC fragments in an extraction window that are located (at least partially) within an interaction zone. An interaction zone may refer to any determine section of an extraction window, through which the hotspot processing engine 110 may characterize certain OPC fragments as hotspot fragments.

Such an example is shown in FIG. 3 through the interaction zone 310, which the hotspot processing engine 110 may define as a circular enclosure centered around hotspot location₁ (denoted with a "+" symbol). Any OPC fragments that are partially or fully enclosed by the interaction zone 310 may be identified by the hotspot processing engine 110 as hotspot fragments. The radius of the interaction zone 310 (or any other size or area parameter) may be configurable, allowing the hotspot processing engine 110 to flexibly control the precision or granularity at which hotspot fragments are characterized in layout data.

Interaction zones may be set by the hotspot processing engine 110 in various ways, whether as circular shapes defined by a radius value, as bounding boxes with predetermined or configurable dimension, and the like. In some implementations, the hotspot processing engine 110 may apply a threshold distance parameter (e.g., radius) for interaction zones and determine, as hotspot fragments, any OPC fragments located within a threshold distance range from the hotspot location of an extraction window.

In FIG. 3, the hotspot processing engine 110 identifies six (6) OPC fragments in the layout data 240 as being partially or fully enclosed by the interaction zone 310, and thus identifies these six (6) OPC fragments as hotspot fragments 320 for this given hotspot location. The hotspot fragments 320 shown in FIG. 3 are also patterned with vertical lines. After identification of hotspot fragments in an extraction window, the hotspot processing engine 110 may extract hotspot fragment feature vectors for the given hotspot location from the hotspot fragments 320. The hotspot processing engine 110 may extract a feature vector from a given OPC fragment in any number forms, and each feature vector extracted from layout data of a circuit design may represent a discrete OPC fragment (or other circuit portion) of a circuit design.

The hotspot processing engine 110 may extract feature vectors of any type or format, and extracted fragment feature vectors may track any number of characteristics of OPC fragments of a circuit design. In some implementations, extracted feature vectors may take the form of n-dimensional vectors of numerical parameters values captured for OPC fragments. As an illustrative example, a feature vector extracted by the hotspot processing engine 110 may represent a given OPC fragment in a layout design and example parameter values of the extracted feature vector may numerically represent OPC fragment and geometry data, fragment lengths, simulation or convolution-based geometry data of the OPC fragment and neighboring fragments, contour data, fragment positional data, neighboring geometry, or any number of additional or alternative characteristics specific to the OPC fragment. In some implementations, the hotspot processing engine 110 may extract feature vectors that represent micro-level characteristics of OPC fragments (whether for the OPC fragment itself or neighboring OPC fragments, but not for entire chip parameters or characteristics). As such, the hotspot processing engine 110 may extract feature vectors from OPC fragments of a circuit design (including for both hotspot fragments and non-hotspot fragments). As noted herein, the hotspot processing engine 110 may differentiate between different types of hotspot fragments and label extracted hotspot fragment feature vectors generally as hotspots (e.g., in a binary classification) or based on hotspot type (e.g., bridge, pinch, etc.), doing so based on circuit geometry analyses, outputs of SEM hotspot verifications, historical chip trends, and the like.

Continuing the classification discussion for FIG. 3, the hotspot processing engine 110 may classify some OPC fragments of an extraction window as uncertainty fragments. Uncertainty fragments may include OPC fragments of an interaction window that cannot be definitely characterized as hotspot or non-hotspot OPC fragments. In some examples, the hotspot processing engine 110 may identify, as uncertainty fragments, any OPC fragments located within the same polygon as a determined hotspot fragment. To illustrate through FIG. 3, each of the hotspot fragments 320 determined by the hotspot processing engine 110 are located on the same polygon of the layout data 240, namely polygon 241. In this case, the hotspot processing engine 110 may identify the remaining OPC fragments of polygon 241 as uncertainty fragments 330 (remaining in that the uncertainty fragments are located within the extraction window and not classified as hotspot fragments 320). In FIG. 3, the uncertainty fragments 330 include the fragments of polygon 241 labeled through arrows as uncertainty fragments 330, though note that for visual clarity, not all of the uncertainty fragments 330 are labeled in FIG. 3 with an arrow.

The hotspot processing engine 110 may classify some OPC fragments as uncertainty fragments based on precision or accuracy limitations of modern chip inspection techniques, such as BFI an SEM. For instance, SEM imaging techniques may identify circuit hotspots and defects within an accuracy of 10-12 nm, and a particular hotspot location specified in an SEM image may be off by an error range of 10-12 nm. As such, the corresponding OPC fragments that surround a hotspot location in an SEM image (e.g., within an interaction zone) may or may not be the actual OPC fragments that surround the exact defect location of the circuit hotspot. Also, manufacturing process shifts may cause pinpoint hotspot locations to be inaccurate, and thus accurate characterization of OPC fragments on the same polygon at which a hotspot occurs may not be possible.

To avoid uncertainty and the potential of inaccurate labeling, the hotspot processing engine 110 may instead discard any uncertainty fragments located on the same polygon as hotspot fragments from inclusion in training data for ML modeling. Discarding of uncertainty fragments may refer to a process by which the hotspot processing engine 110 determines not to extract feature vectors for specific the OPC fragments of an extraction window identified as uncertainty fragments, and thus exclude characterization of such OPC fragments in generated training data. As such, in some cases, the hotspot processing engine 110 may extract feature vectors for some, but not all, of the OPC fragments within an extraction window for a given hotspot location (particularly when a polygon includes additional OPC fragments aside from determined hotspot fragments, and such additional OPC fragments will be classified as uncertainty fragments and thus discarded/not included in a training set for ML modeling). Identification and discarding of uncertainty fragments may increase the accuracy of ML training data, and thus increase the accuracy of ML-based hotspot predictions using training data without feature vectors representative of uncertainty fragments.

Continuing the classification examples, the hotspot processing engine 110 may also determine non-hotspot fragments in an extraction window. The hotspot processing engine 110 may do so by determining, as non-hotspot fragments, OPC fragments not determined as hotspot fragments (e.g., not within a threshold distance range from a given hotspot location) and not determined as the uncertainty fragments. For example, the hotspot processing engine 110 may classify non-hotspot fragments as the OPC fragments of polygons in an extraction window that do not include hotspot fragments, such as the polygons 242 and 243 shown in FIG. 3.

In this example, the hotspot processing engine 110 determines the non-hotspot fragments 340 as the OPC fragments of polygon 242 and 243 in FIG. 3 (note that for visual clarity, arrows to the non-hotspot fragments 340 of polygon 243 are not expressly illustrated). Then, the hotspot processing engine 110 extract non-hotspot fragment feature vectors for a given hotspot location (in this case, hotspot location$_1$) from the determined non-hotspot fragments 340. Feature vector extraction from the non-hotspot fragments 340 may be performed in a consistent manner as used to extract the hotspot fragment feature vectors from the hotspot fragments 320.

In any of the ways described herein, the hotspot processing engine 110 may extract feature vectors for hotspot locations of an input data set. In doing so, the hotspot processing engine 110 may extract relevant OPC fragments or other circuit, layout, or design-specific characteristics of hotspot portions (e.g., classified as hotspot fragments) and non-hotspot portions (e.g., as classified as non-hotspot fragments). Put another way, "hotspot" and "non-hotspot" classifications (or multi-class "hotspot" designations based on hotspot type) may be used by the hotspot processing engine 110 as labels for the fragment feature vectors that comprise a ML training set. Extracted fragment feature vectors from layout designs may thus form the basis of a labeled training data for ML models, though further processing of extracted fragment feature vectors are also contemplated herein. Examples of feature vector processing in support of ML-based hotspot prediction and according to the present disclosure are described next with reference to FIGS. 4 and 5.

Figure 4:
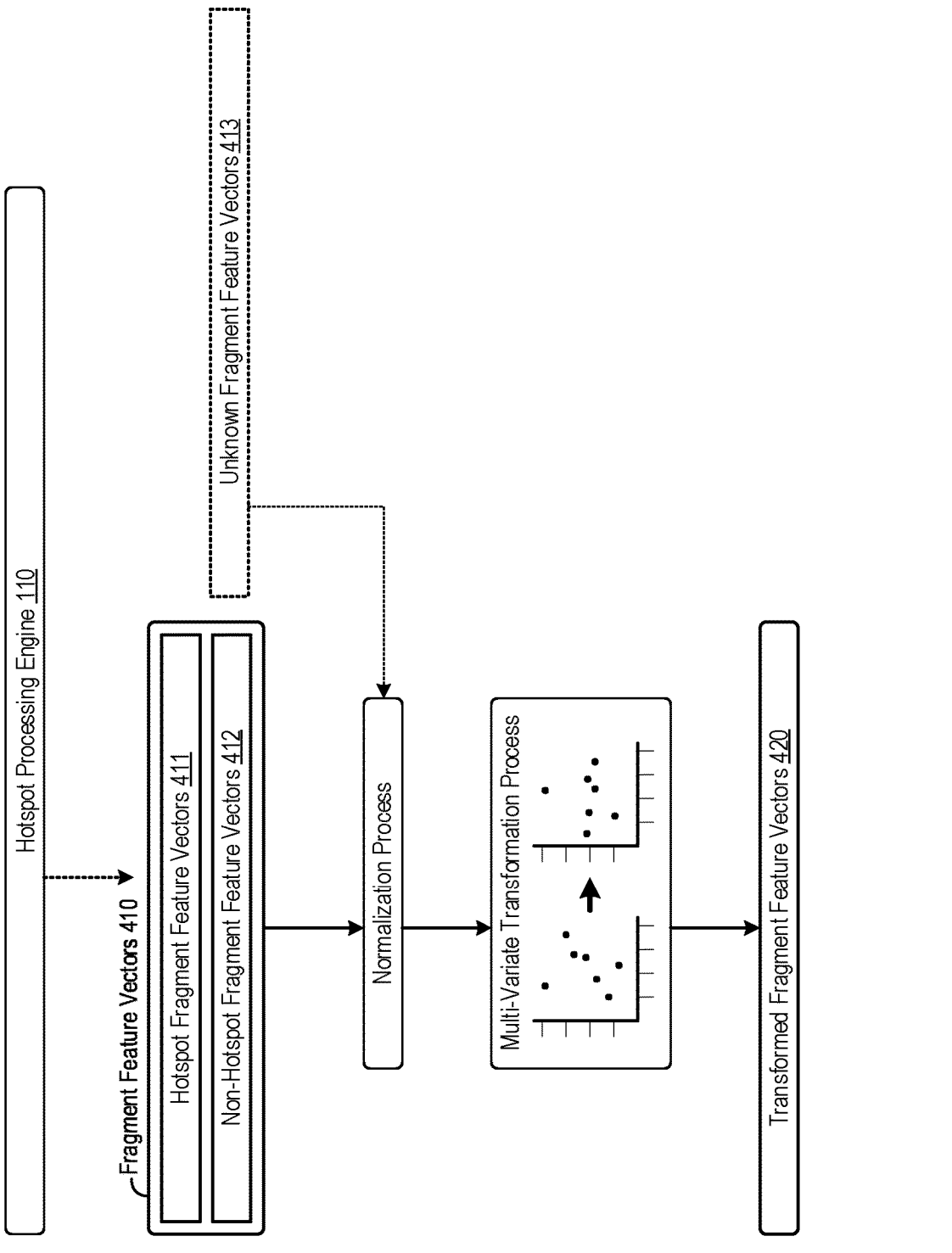
FIG. 4 shows examples of normalization and transformation processing of fragment feature vectors by the hotspot processing engine in support of ML-based hotspot prediction.

FIG. 4 shows examples of normalization and transformation processing of fragment feature vectors by the hotspot processing engine 110 in support of ML-based hotspot prediction. In the example of FIG. 4, the hotspot processing engine 110 processes the fragment feature vectors 410, which include both hotspot fragment feature vectors 411 and non-hotspot fragment feature vectors 412. The hotspot processing engine 110 may generate or extract the fragment feature vectors 410 from hotspot locations, and do so in any of the ways described herein.

As an example of fragment feature vector processing, the hotspot processing engine 110 performs a data normalization process on the fragment feature vectors 410. Any number of normalization techniques may be applied by the hotspot processing engine 110 to normalize the parameter values of extracted feature vectors, for example through min/max scaler or other normalization processes. Normalization of the fragment feature vectors 410 may reduce artificial weight differences between features (e.g., parameters) of OPC fragments, particularly when features are measured in different units, and doing so may increase data integrity in representing the fragment feature vectors.

In some implementations, that hotspot processing engine 110 may extract additional fragment feature vectors from a circuit design in support of normalizing the fragment feature vectors 410 extracted for detected hotspot locations in the circuit design. Such additional fragment feature vectors may be referred to as unknown fragment feature vectors, as such feature vectors may be extracted from OPC fragments of other chip-portions unrelated or independent of the detected hotspot locations of an input data set (and thus unknown whether the OPC fragments include undetected hotspots or not). In FIG. 4, the hotspot processing engine 110 may extract fragment feature vectors from additional portions of a layout design and use these extracted fragment feature vectors labeled as the unknown fragment feature vectors 413 normalizing the fragment feature vectors 410.

The hotspot processing engine 110 may extract the unknown fragment feature vectors 413 in various ways. In some instances, the hotspot processing engine 110 may sample random partitions of a layout design and extract feature vectors from OPC fragments located within the randomly-sampled partitions of a circuit. As another example, the hotspot processing engine 110 may use any number of precise or fuzzy pattern matching techniques to identify matching circuit portions with a similar geometry to the hotspot locations of an input data set. Such similarity determinations may vary based on the particular similarity criteria of pattern matching techniques applied by the hotspot processing engine 110, and the hotspot processing engine 110 may extract feature vectors from OPC fragments of these pattern-matched circuit portions to generate the unknown fragment feature vectors 413.

The unknown fragment feature vectors 413 may increase the number of fragment feature vectors used in a normalization process. By applying an increased set of fragment feature vectors for data normalization, the hotspot processing engine 110 may provide a fuller representation of OPC fragments in a circuit design. Doing so may avoid overly narrow normalization ranges that do not account for OPC fragments circuit portions outside of the determined extraction windows for detected hotspot locations. Also, enlarging the universe of extracted feature vectors through the addition of the unknown feature vectors may allow the hotspot processing engine 110 to ensure a proper data range for the data normalization, which may then increase the accuracy, range, and effectiveness of hotspot representations via feature vectors for ML-based hotspot predictions.

Continuing examples of fragment feature vector processing, the hotspot processing engine 110 may apply a multivariate transformation process to the fragment feature vectors 410. In some implementations, the hotspot processing engine 110 performs the multi-variate transformation after normalization, and does so only for the normalized hotspot and non-hotspot fragment feature vectors. That is, the hotspot processing engine 110 may utilize the unknown fragment feature vectors 413 to increase the effectiveness of data normalization, but need not further process the unknown fragment feature vectors 413 or include the unknown fragment feature vectors 413 as part of a ML training set, as such unknown fragment feature vectors 413 are not labeled as hotspot fragment feature vectors or non-hotspot fragment feature vectors.

In applying the multi-variate transformation process, the hotspot processing engine 110 may transform a feature space of an accessed feature vector set using any number of multi-variate analysis techniques. In some implementations, the hotspot processing engine 110 transforms a feature space through principal component analysis ("PCA"). As such, the hotspot processing engine 110 may implement any type of PCA or any other multi-variate transformation or dimensionality reduction capabilities to support the transformation of feature spaces. By performing PCA (or any other multivariate transformation) on a feature space of the fragment feature vectors 410, the hotspot processing engine 110 may map the fragment feature vectors 410 into a different coordinate system that further correlates the parameter values of OPC fragments and supports variance determinations or other data processing capabilities with increased effectiveness, precision, or efficiency. In FIG. 4, the hotspot processing engine 110 obtains the transformed fragment feature vectors 420 after applying the multi-variate transformation process.

In any of the ways described herein, the hotspot processing engine 110 may process fragment feature vectors through normalization processes, multi-variate transformation processes, or combinations of both. Additionally or alternatively to the processing features described in FIG. 4, the hotspot processing engine 110 may process fragment feature vectors through data balancing, and may do so to ensure hotspot OPC fragments are proportionally or meaningfully represented in a training data set to support effective ML training and modeling. Example data balancing features are described in greater detail next.

Figure 5:
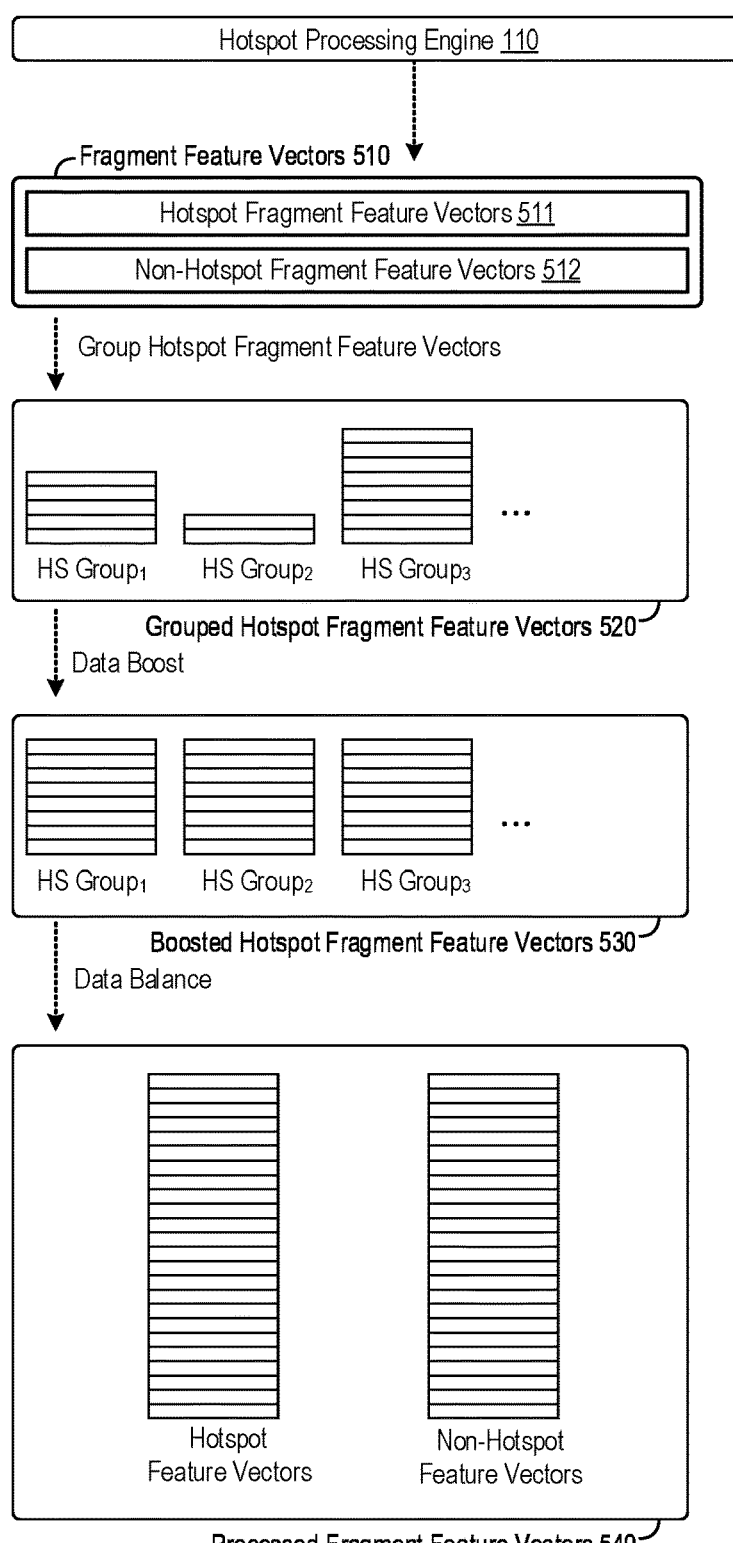
FIG. 5 shows an example of data balancing of fragment feature vectors by the hotspot processing engine.

FIG. 5 shows an example of data balancing of fragment feature vectors by the hotspot processing engine 110. In the example of FIG. 5, the hotspot processing engine 110 processes the fragment feature vectors 510, which include both hotspot fragment feature vectors 511 and non-hotspot fragment feature vectors 512. The hotspot processing engine 110 may generate or extract the fragment feature vectors 510 from hotspot locations, and do so in any of the ways described herein. In some instances, the fragment feature vectors 510 may be normalized and/or transformed prior to data balancing, and may, for example, be similar to the transformed fragment feature vectors 420 described above for FIG. 4.

In data balancing the fragment feature vectors 510, the hotspot processing engine 110 may ensure that the hotspot fragment feature vectors 511 (or sub-categories of the hotspot fragment feature vectors 511) form a statistically significant portion of a training set provided to an ML model. Doing so may ensure that hotspot fragment feature vectors include a sufficient number of samples such that a ML model can properly learn, process, characterize, or predict circuit hotspots. This may be particularly important in that SEM images or other hotspot inspection techniques may cover a small portion of an overall chip design (e.g., with hotspot locations of an input data set representing less than 1% of overall chip area). Moreover, determination of hotspot fragments and non-hotspot fragments as described herein may result in a number of determined non-hotspot fragments significantly greater than the number of determined hotspot fragments (e.g., up to a 50× different or more). As such, the data balancing features described herein may provide a mechanism to ensure that training data provided to a ML model properly weights hotspot fragment feature vectors in order to support accurate machine learning of hotspot characteristics and increase the effectiveness of subsequent ML-based hotspot prediction.

In processing the fragment feature vectors 510, the hotspot processing engine 110 may group the hotspot fragment feature vectors 511 according to any number of hotspot characteristics of the hotspot fragment feature vectors. In some instances, the hotspot processing engine 110 may characterize each hotspot feature vector according to a set of characteristic parameter values, and each group of hotspot feature fragment vectors may be determined based on the characteristic parameter values of the hotspot fragment feature vectors 511.

As an example implementation, the hotspot processing engine 110 may group the hotspot fragment feature vectors 511 based on process-specific parameters attributable to the hotspot fragment feature vectors 511. Examples of process-specific parameters may include macro-level parameters like chip name, layer name, process identifiers, wafer identifiers, lot identifiers, dose values, focus values, round values, hot spot type parameters (e.g., pinch, bridge, etc.), chip and wafer-level process related heatmap lookup data, such as positional flare values from extreme ultraviolet ("EUV") flare maps, density values from chemical mechanical polishing ("CMP") density maps, or other customizable or user-configurable properties such as configured hotspot severity levels and the like. The characteristic parameter values for each hotspot fragment feature vector may serve as a unique group identifier, by which the hotspot processing engine 110 may group, cluster, or otherwise classify the hotspot fragment feature vectors 511 into different groupings. The number of groups may be configured by the hotspot processing engine 110 based on the number of characteristic parameter values used in the grouping process, as well as the number of unique values among the fragment feature vectors for each individual characteristic parameter value. In the example shown in FIG. 5, the hotspot processing engine 110 groups the hotspot fragment feature vectors 511 into the grouped hotspot fragment feature vectors 520, which include the groups labeled as HS $Group_1$, HS $Group_2$, HS $Group_3$, and so on.

The hotspot processing engine 110 may data boost the grouped hotspot fragment feature vectors 520 to ensure that each grouping of hotspot fragment feature vectors reaches a statistical threshold. By doing so, the hotspot processing engine 110 may ensure that lesser-represented groups of hotspot fragment feature vectors have a sufficient number of data samples such that a ML model can effectively learn and identify hotspots characterized with characteristic parameter values of the lesser-represented groups. In some examples, the hotspot processing engine 110 may data boost the grouped hotspot fragment feature vectors 520 so that each group of hotspot fragment feature vectors has the same number of hotspot fragment feature vectors. In some implementations, the hotspot processing engine 110 does so by duplicating randomly selected or specifically selected hotspot fragment feature vectors of a given group of hotspot fragment feature vectors to reach a particular numerical threshold, e.g., to reach the number of hotspot fragment feature vectors of the particular group with the highest number of hotspot fragment feature vectors among the grouped hotspot fragment feature vectors 520 or a predetermined numerical value (e.g., 500,000 samples).

In some examples, the hotspot processing engine 110 may ensure an even distribution of hotspot fragment feature vectors across each of the groups of the grouped hotspot fragment feature vectors 520. By doing so, the hotspot processing engine 110 may level the training data provided to an ML model to ensure that no particular hotspot group (as characterized by characteristic parameter values) is overly weighted in the machine learning process. In other examples, the hotspot processing engine 110 may weight the numerical values of certain groups (e.g., as determined by a hotspot severity characteristic) to be lesser or higher among the numerical distribution of hotspot fragment feature vectors among the various groups. In FIG. 5, the hotspot processing engine 110 obtains boosted hotspot fragment feature vectors 530 after data boosting the grouped hotspot fragment feature vectors 520.

In processing the fragment feature vectors 510, the hotspot processing engine 110 may data balance hotspot and non-hotspot fragment feature vectors. As noted herein, feature vector extraction may skew to an increased number of non-hotspot fragment feature vectors as compared to hotspot fragment feature vectors (e.g., up to a 50:1 ratio or more). To support effective ML training of hotspot prediction, the hotspot processing engine 110 balance the fragment feature vectors 510 such that the hotspot fragment feature vectors 511 are at least a threshold percentage of the total number of fragment feature vectors or put another way, to ensure that the ratio between hotspot and non-hotspot fragment feature vectors meets at least a threshold ratio, such as 1:1.

To do so, the hotspot processing engine 110 may data boost the hotspot fragment feature vectors to reach a threshold number, e.g., via data duplication of randomly or specifically-selected hotspot fragment feature vectors. Note that in doing so, the hotspot processing engine 110 may maintain a requisite numerical distribution amongst the different groups of hotspot fragment feature vectors (e.g. by duplicating the boosted hotspot fragment feature vectors 530 consistently across each group to maintain the requisite numerical distribution).

Additionally or alternatively, the hotspot processing engine 110 may data balance the fragment feature vectors 510 by down sampling non-hotspot fragment feature vectors until the threshold percentage or ratio is reached. In some implementations, the hotspot processing engine 110 may perform the data boosting of grouped hotspot fragment feature vectors 520 in combination with the data balancing of hotspot to total fragment feature vectors (or ratio to non-hotspot fragment feature vectors), instead of performing these data boosting and data balancing processes in sequence.

Accordingly, the hotspot processing engine 110 may data balance fragment feature vectors. In FIG. 5, the hotspot processing engine 110 may process the fragment feature vectors 510 through data balancing to obtain the processed fragment feature vectors 540. In processing fragment feature vectors, the hotspot processing engine 110 may address data minority problems that may later impact the capability or effectiveness of ML models to predict specific types of hotspots without proper representation in a training set. Through ensuring statistical significance for hotspot fragment feature vectors (and, groups thereof), the hotspot processing engine 110 may increase the range and ability of a trained ML model to predict hotspots of different types and that occur in full range or manufacturing process conditions.

In any of the ways described herein, the hotspot processing engine 110 may extract fragment feature vectors for hotspot locations of a circuit design and process the fragment feature vectors in support of ML-based hotspot prediction. In particular, the hotspot processing engine 110 may provide processed fragment feature vectors as a labeled training data set to a ML-model from which to learn and implement hotspot prediction capabilities. As fragment feature vectors may be processed through normalization, multi-variate transformations, data boosting, and/or balancing techniques, the hotspot processing engine 110 may specifically prepare the training set provided to ML models to increase the capability, efficiency, accuracy, and range of ML-based hotspot predictions. Then, a ML model trained using the labeled training data described herein may be applied to predict hotspot locations for full-chip designs.

Figure 6:
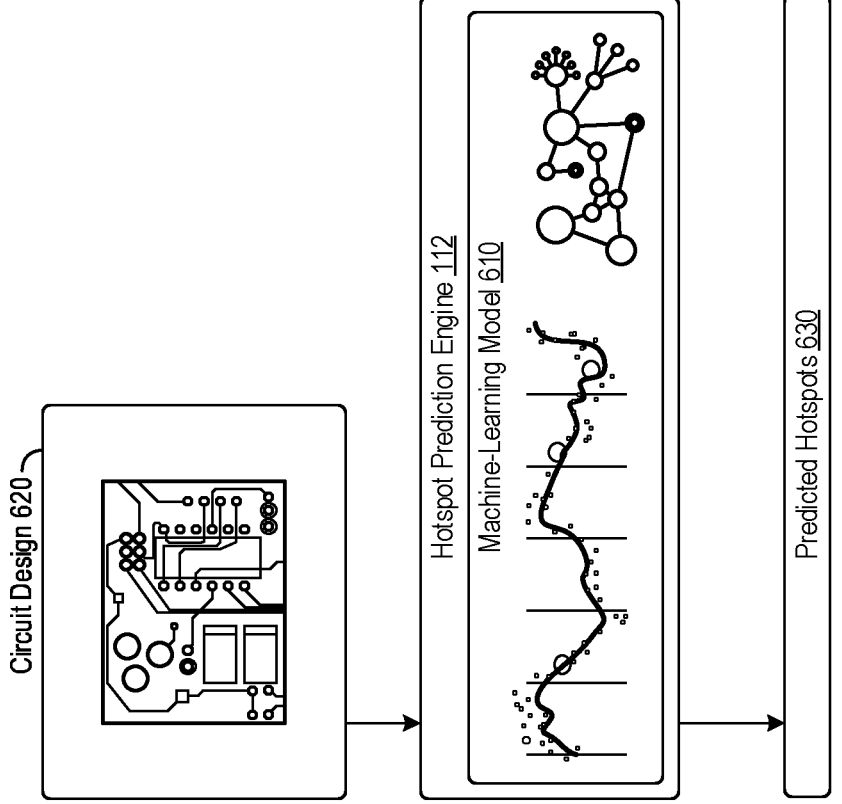
FIG. 6 shows an example application of a ML-model by a hotspot prediction engine to characterize locations of a circuit design.

FIG. 6 shows an example application of a ML-model by a hotspot prediction engine 112 to characterize locations of a circuit design. In FIG. 6, the hotspot prediction engine 112 implements a ML model 610 that is trained using fragment feature vectors extracted and processed in any of the ways described herein. The processed fragment feature vectors may be labeled via the hotspot and non-hotspot designations determined by the hotspot processing engine 110 (which may include multi-class labeling with multiple types of hotspots), and may thus be used as training data in any number of supervised learning techniques.

The ML model 610 may implement or provide any number of machine learning techniques and capabilities to analyze, interpret, and utilize the processed fragment feature vectors for hotspot prediction. For instance, the ML model 610 may implement any number of supervised (e.g., support vector machines, or other supervised learning techniques), semi-supervised, unsupervised, or reinforced learning models to characterize OPC fragments of any portion of a circuit design based on a probability, class, or other ML output indicative of a hotspot prediction. In some instances, the ML model 610 may generate a hotspot probability that a given OPC fragment is a hotspot fragment, and the hotspot prediction engine 112 may identify any OPC fragment with a hotspot probability that exceeds a predetermined threshold as a predicted hotspot.

To illustrate through FIG. 6, the hotspot prediction engine 112 may access a circuit design 620. The circuit design 620 may be the circuit design from which the training data for the ML model 610 was generated, and may take the form of a layout design decomposed into OPC fragments. The hotspot prediction engine 112 may perform a full-chip analysis on the circuit design 620, for example by providing as inputs, extracted feature vectors for each OPC fragment of the circuit design 620 (which may be normalized and/or transformed into a format consistent with the processed fragment feature vectors provided as training data to the ML model 610). The ML model 610 may analyze each OPC fragment and generate a hotspot probability or other form of classification, which the hotspot prediction engine 112 may aggregate and analyze. As noted herein, the hotspot prediction engine 112 may characterize any OPC fragment with a hotspot probability that exceeds a threshold (e.g., >0.1 or any other configurable value) as a predicted hotspot. Then, the hotspot prediction engine 112 may output the predicted hotspots 630 for the circuit design 620 as a set of care areas for further inspection or defect confirmation.

While many ML-based hotspot prediction features have been described herein through illustrative examples presented through various figures, the hotspot processing engine 110 and hotspot prediction engine 112 may implement any combination of the ML-based hotspot prediction features described herein.

FIG. 7 shows an example of logic 700 that a system may implement to support ML-based hotspot prediction. For example, the computing system 100 may implement the logic 700 as hardware, executable instructions stored on a machine-readable medium, or as a combination of both. The computing system 100 may implement the logic 700 via the hotspot processing engine 110 and hotspot prediction engine 112, through which the computing system 100 may perform or execute the logic 700 as a method to support ML-based hotspot prediction. The following description of the logic 700 is provided using the hotspot processing engine 110 and hotspot prediction engine 112 as examples. However, various other implementation options by systems are possible.

In implementing the logic 700, the hotspot processing engine 110 may access an input data set of hotspot locations on manufactured circuits of a circuit design (702), correlate the hotspot locations to layout data for the circuit design (704), and extract fragment feature vectors for the hotspot locations from OPC fragments of the layout data (706). The extracted fragment feature vectors may include both hotspot fragment feature vectors and non-hotspot fragment feature vectors for the hotspot locations. In implementing the logic 700, the hotspot processing engine 110 may further process the fragment feature vectors (708), doing so in any of the ways described herein, as well as provide the processed fragment feature vectors as a training set for training a machine-learning model. In implementing the logic 700, hotspot prediction engine 112 may apply the machine-learning model to characterize locations of the circuit design as a hotspot location or a non-hotspot location (712).

The logic 700 shown in FIG. 7 provides an illustrative example by which a computing system 100 may support ML-based hotspot prediction. Additional or alternative steps in the logic 700 are contemplated herein, including according to any of the features described herein with regards to the hotspot processing engine 110, hotspot prediction engine 112, or combinations of both.

Figure 8:
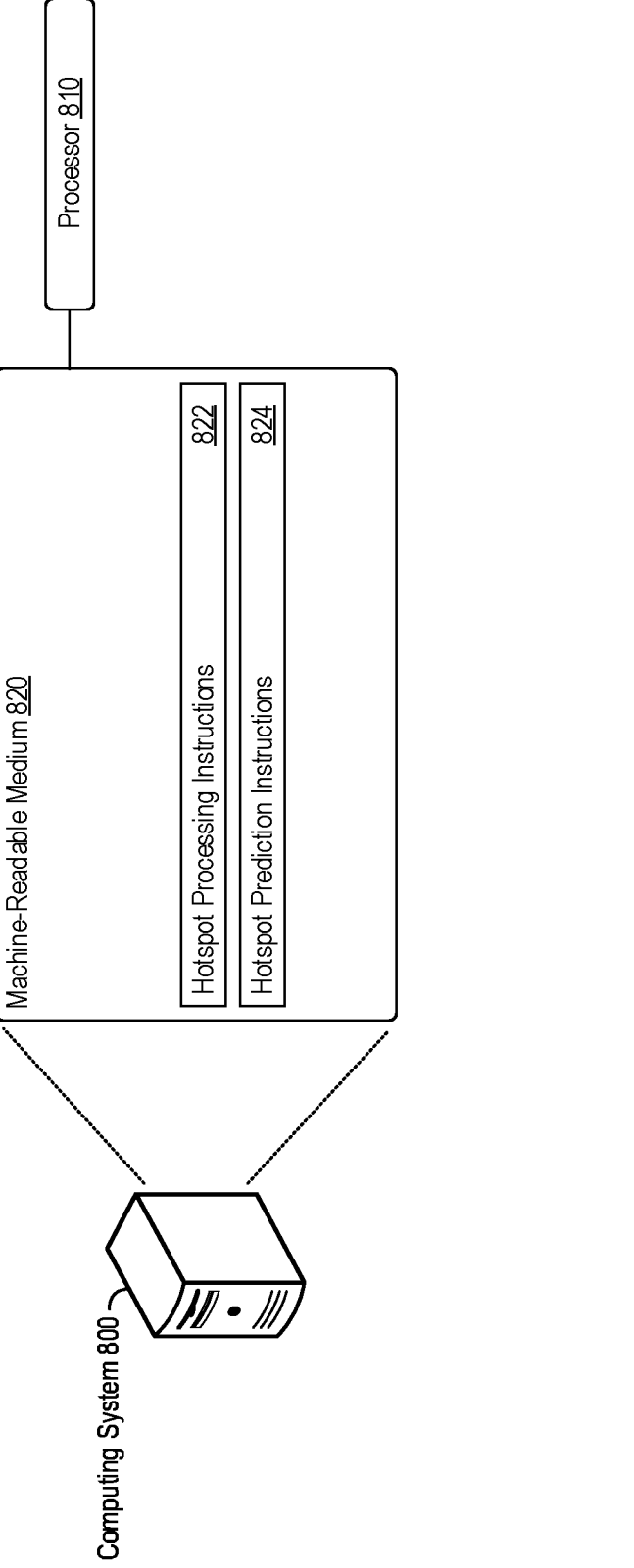
FIG. 8 shows an example of a computing system that supports ML-based hotspot prediction.

FIG. 8 shows an example of a computing system 800 that supports ML-based hotspot prediction. The computing system 800 may include a processor 810, which may take the form of a single or multiple processors. The processor(s) 810 may include a central processing unit (CPU), microprocessor, or any hardware device suitable for executing instructions stored on a machine-readable medium. The computing system 800 may include a machine-readable medium 820. The machine-readable medium 820 may take the form of any non-transitory electronic, magnetic, optical, or other physical storage device that stores executable instructions, such as the hotspot processing instructions 822 and the hotspot prediction instructions 824 shown in FIG. 8. As such, the machine-readable medium 820 may be, for example, Random Access Memory (RAM) such as a dynamic RAM (DRAM), flash memory, spin-transfer torque memory, an Electrically-Erasable Programmable Read-Only Memory (EEPROM), a storage drive, an optical disk, and the like.

The computing system 800 may execute instructions stored on the machine-readable medium 820 through the processor 810. Executing the instructions (e.g., the hotspot processing instructions 822 and/or the hotspot prediction instructions 824) may cause the computing system 800 to perform any of the ML-based hotspot prediction features described herein, including according to any of the features of the hotspot processing engine 110, hotspot prediction engine 112, or combinations of both.

For example, execution of the hotspot processing instructions 822 by the processor 810 may cause the computing system 800 to access an input data set of hotspot locations on manufactured circuits of a circuit design; correlate the hotspot locations to layout data for the circuit design; extract fragment feature vectors for the hotspot locations from OPC fragments of the layout data, including hotspot fragment feature vectors and non-hotspot fragment feature vectors for the hotspot locations; process the fragment feature vectors such that the hotspot fragment feature vectors are a threshold percentage of the total number of feature vectors in the fragment feature vectors; and provide the processed fragment feature vectors. Execution of the hotspot prediction instructions 824 by the processor 810 may cause the computing system 800 to apply the machine-learning model to characterize locations of the circuit design as a hotspot location or a non-hotspot location.

Any additional or alternative ML-based hotspot prediction features as described herein may be implemented via the hotspot processing instructions 822, hotspot prediction instructions 824, or a combination of both.

The systems, methods, devices, and logic described above, including the hotspot processing engine 110 and hotspot prediction engine 112, may be implemented in many different ways in many different combinations of hardware, logic, circuitry, and executable instructions stored on a machine-readable medium. For example, the hotspot processing engine 110, hotspot prediction engine 112, or combinations thereof, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine-readable instructions stored on the medium, which when executed in an endpoint, computer system, or other device, cause the device to perform operations according to any of the description above, including according to any features of the hotspot processing engine 110, hotspot prediction engine 112, or combinations thereof.

The processing capability of the systems, devices, and engines described herein, including the hotspot processing engine 110 and hotspot prediction engine 112, may be distributed among multiple system components, such as among multiple processors and memories, optionally including multiple distributed processing systems or cloud/network elements. Parameters, databases, and other data structures may be separately stored and managed, may be incorporated into a single memory or database, may be logically and physically organized in many different ways, and may be implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A method comprising:

by a computing system:

accessing an input data set of hotspot locations on manufactured circuits of a circuit design;

correlating the hotspot locations to layout data for the circuit design;

extracting fragment feature vectors for the hotspot locations from optical proximity correction (OPC) fragments of the layout data, including hotspot fragment feature vectors and non-hotspot fragment feature vectors for the hotspot locations;

processing the fragment feature vectors such that the hotspot fragment feature vectors are a threshold percentage of the total number of feature vectors in the fragment feature vectors;

providing the processed fragment feature vectors as a training set for training a machine-learning model; and applying the machine-learning model to characterize locations of the circuit design as a hotspot location or a non-hotspot location, wherein processing the fragment feature vectors comprises data boosting the hotspot fragment feature vectors to the threshold percentage of the total number of feature vectors in the fragment feature vectors, wherein processing the fragment feature vectors further comprises grouping the hotspot fragment feature vectors according to hotspot characteristics prior to data boosting the hotspot fragment feature vectors, and wherein the data boosting of the hotspot fragment feature vectors is performed according to balancing criteria applied for the grouped hotspot fragment feature vectors.

2. The method of claim 1, wherein the input data set further comprises non-hotspot locations of the circuit design, and further comprising:

correlating the non-hotspot locations to the layout data; and extracting non-hotspot fragment feature vectors from the layout data that correspond to the non-hotspot locations.

3. The method of claim 1, wherein extracting comprises, for a given hotspot location, determining an extraction window for the layout data based on a position of the given hotspot location in the circuit design and an uncertainty range of an imaging technique used to detect the given hotspot location in a manufactured circuit.

4. The method of claim 1, wherein extracting further comprises, for a given hotspot location:

determining, as hotspot fragments, OPC fragments within a threshold distance range from the given hotspot location; and extracting hotspot fragment feature vectors for the given hotspot location from the hotspot fragments.

5. The method of claim 4, wherein extracting further comprises, for the given hotspot location:

identifying uncertainty fragments on a same polygon as at least one of the determined hotspot fragments;

determining, as non-hotspot fragments, OPC fragments not within the threshold distance range from the hotspot location and not identified as the uncertainty fragments; and extracting non-hotspot fragment feature vectors for the given hotspot location from the non-hotspot fragments.

6. A system comprising:

a hotspot processing engine configured to:

access an input data set of hotspot locations on manufactured circuits of a circuit design;

correlate the hotspot locations to layout data for the circuit design;

extract fragment feature vectors for the hotspot locations from optical proximity correction (OPC) fragments of the layout data, including hotspot fragment feature vectors and non-hotspot fragment feature vectors for the hotspot locations;

process the fragment feature vectors such that the hotspot fragment feature vectors are a threshold percentage of the total number of feature vectors in the fragment feature vectors; and provide the processed fragment feature vectors as a training set for training a machine-learning model, wherein the hotspot processing engine is configured to process the fragment feature vectors by data boosting the hotspot fragment feature vectors to the threshold percentage of the total number of feature vectors in the fragment feature vectors, wherein the hotspot processing engine is configured to process the fragment feature vectors further by grouping the hotspot fragment feature vectors according to hotspot characteristics prior to data boosting the hotspot fragment feature vectors, and wherein the hotspot processing engine is configured to data boost the hotspot fragment feature vectors according to balancing criteria applied for the grouped hotspot fragment feature vectors; and a hotspot prediction engine configured to apply the machine-learning model to characterize locations of the circuit design as a hotspot location or a non-hotspot location.

7. The system of claim 6, wherein the input data set further comprises non-hotspot locations of the circuit design, and wherein the hotspot processing engine is further configured to:

correlate the non-hotspot locations to the layout data; and extract non-hotspot fragment feature vectors from the layout data that correspond to the non-hotspot locations.

8. The system of claim 6, wherein the hotspot processing engine is further configured to extract the fragment feature vectors by, for a given hotspot location, determining an extraction window for the layout data based on a position of the given hotspot location in the circuit design and an uncertainty range of an imaging technique used to detect the given hotspot location in a manufactured circuit.

9. The system of claim 6, wherein the hotspot processing engine is further configured to extract the fragment feature vectors by, for a given hotspot location:

determining, as hotspot fragments, OPC fragments within a threshold distance range from the given hotspot location; and extracting hotspot fragment feature vectors for the given hotspot location from the hotspot fragments.

10. The system of claim 9, wherein the hotspot processing engine is further configured to extract the fragment feature vectors by, for the given hotspot location:

identifying uncertainty fragments on a same polygon as at least one of the determined hotspot fragments;

determining, as non-hotspot fragments, OPC fragments not within the threshold distance range from the hotspot location and not identified as the uncertainty fragments; and extracting non-hotspot fragment feature vectors for the given hotspot location from the non-hotspot fragments.

11. The non-transitory computer-readable medium of claim 6, wherein the instructions further cause the computing system to extract the fragment feature vectors by, for a given hotspot location, determining an extraction window for the layout data based on a position of the given hotspot location in the circuit design and an uncertainty range of an imaging technique used to detect the given hotspot location in a manufactured circuit.

12. A non-transitory computer-readable medium comprising instructions that, when executed by a processor, cause a computing system to:

access an input data set of hotspot locations on manufactured circuits of a circuit design;

correlate the hotspot locations to layout data for the circuit design;

extract fragment feature vectors for the hotspot locations from optical proximity correction (OPC) fragments of the layout data, including hotspot fragment feature vectors and non-hotspot fragment feature vectors for the hotspot locations;

process the fragment feature vectors such that the hotspot fragment feature vectors are a threshold percentage of the total number of feature vectors in the fragment feature vectors; and provide the processed fragment feature vectors as a training set for training a machine-learning model; and apply the machine-learning model to characterize locations of the circuit design as a hotspot location or a non-hotspot location, wherein the instructions cause the computing system to process the fragment feature vectors further by:

grouping the hotspot fragment feature vectors according to hotspot characteristics prior to data boosting the hotspot fragment feature vectors, and data boosting the hotspot fragment feature vectors to the threshold percentage of the total number of feature vectors in the fragment feature vectors according to balancing criteria applied for the grouped hotspot fragment feature vectors.

13. The non-transitory computer-readable medium of claim 12, wherein the input data set further comprises non-hotspot locations of the circuit design, and wherein the instructions further cause the computing system to:

correlate the non-hotspot locations to the layout data; and extract non-hotspot fragment feature vectors from the layout data that correspond to the non-hotspot locations.

14. The non-transitory computer-readable medium of claim 12, wherein the instructions further cause the computing system to extract the fragment feature vectors by, for a given hotspot location:

determining, as hotspot fragments, OPC fragments within a threshold distance range from the given hotspot location; and extracting hotspot fragment feature vectors for the given hotspot location from the hotspot fragments.

15. The non-transitory computer-readable medium of claim 14, wherein the instructions further cause the computing system to extract the fragment feature vectors by, for the given hotspot location:

identifying uncertainty fragments on a same polygon as at least one of the determined hotspot fragments;

determining, as non-hotspot fragments, OPC fragments not within the threshold distance range from the hotspot location and not identified as the uncertainty fragments; and extracting non-hotspot fragment feature vectors for the given hotspot location from the non-hotspot fragments.

* * * * *